(12) United States Patent
Besser et al.

(10) Patent No.: US 6,383,947 B1
(45) Date of Patent: May 7, 2002

(54) ANTI-REFLECTIVE COATING USED IN THE FABRICATION OF MICROCIRCUIT STRUCTURES IN 0.18 MICRON AND SMALLER TECHNOLOGIES

(75) Inventors: Paul R. Besser, Sunnyvale; Bhanwar Singh, Morgan Hill; Darrell M. Erb, Los Altos; Susan H. Chen, Santa Clara; Carmen Morales, S.J., all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/703,513

(22) Filed: Oct. 31, 2000

Related U.S. Application Data (62) Division of application No. 09/205,068, filed on Dec. 4, 1998, now Pat. No. 6,165,855.

(51) Int. Cl.⁷ .................................................. H01L 21/31
(52) U.S. Cl. ...................... 438/758; 438/636; 438/700; 43/271; 43/317; 257/659; 257/751
(58) Field of Search .................................... 438/758, 636, 438/700; 430/317, 271; 257/659, 751

(56) References Cited

U.S. PATENT DOCUMENTS

| | | | |
|---|---|---|---|
| 5,231,053 A | 7/1993 | Bost et al. ................... | 437/190 |
| 5,317,187 A | 5/1994 | Hindman et al. ........... | 257/659 |
| 5,360,995 A | 11/1994 | Graas .......................... | 257/751 |
| 5,582,881 A | 12/1996 | Besser et al. ............... | 427/576 |
| 5,759,916 A * | 6/1998 | Hsu et al. .................... | 438/636 |
| 5,919,599 A * | 7/1999 | Meador et al. .......... | 430/271.1 |
| 5,998,300 A * | 12/1999 | Tabara ......................... | 438/700 |
| 6,103,456 A * | 8/2000 | Tobben et al. .............. | 430/317 |

FOREIGN PATENT DOCUMENTS

| | | | |
|---|---|---|---|
| EP | 0 525 637 A1 | 2/1993 | ............ H05K/3/02 |
| EP | 0 598 422 A1 | 5/1994 | ....... H01L/21/3205 |

* cited by examiner

Primary Examiner—Richard Elms
Assistant Examiner—Pho Luu
(74) Attorney, Agent, or Firm—Lariviere, Grubman & Payne, LLP (57) ABSTRACT

An anti-reflective coating for use in microcircuit fabrication and specifically using ultraviolet photolithographic processes. A three-layered anti-reflective coating is used to enhance metallization etching in the construction of microcircuits. The coating features a titanium nitride anti-reflective layer sandwiched between two titanium metal layers. The upper titanium layer protects subsequently applied deep ultraviolet photoresists from the deleterious effects of the titanium nitride anti-reflective layer. The unique character of the three layer anti-reflective coating allows the use of an efficient single chamber fabrication process to form the three-layer coating.

10 Claims, 7 Drawing Sheets

FIGURE 14

ANTI-REFLECTIVE COATING USED IN THE FABRICATION OF MICROCIRCUIT STRUCTURES IN 0.18 MICRON AND SMALLER TECHNOLOGIES

RELATED APPLICATIONS

This is a divisional application which is related to and claims priority from U.S. Pat. App. Ser. No. 09/205,068, filed Dec. 4, 1998, entitled "Antireflective Coating Used in the Fabrication of Microcircuit Structures in 0.18 Micron and Smaller Technologies," by the same Applicants.

TECHNICAL FIELD

The present invention relates to photolithographic techniques used in semiconductor processing, and more particularly, to the use of antireflective coatings (ARCs) in submicron metallization fabrication processes.Further, the present invention relates to the use of anti-reflective coatings which do not chemically react with deep ultraviolet (DUV) photoresists.The present invention also relates to methods for manufacturing integrated circuits and, particularly, to uses and methods for forming and using DUV ARCs.

BACKGROUND OF THE INVENTION

In the construction of integrated circuit devices, one or more conducting layers (e.g., aluminum, copper, titanium, silicon or various alloys thereof) are deposited and subsequently pattern masked, then etched to create ohmic or Schottky contacts and electrical connections between various circuit elements. Conventionally, thin films of conducting materials are formed; and these films are then spin-coated with a photoresist layer. The photoresist layer is exposed to a light pattern and then developed to form a photoresist mask pattern. Selective etching removes portions of the underlying material through the openings in the photoresist pattern. For example, a metallic aluminum conducting layer would be selectively plasma-etched with chlorine-containing gases. The photoresist is then removed leaving a pattern in the conducting layer.

In the art, when the conducting layers are made of reflective materials (e.g., metallic materials), antireflective coatings (ARCs) have been applied to reduce surface reflection. Typical surfaces benefitting from ARCs are layers formed of polysilicon, aluminum, copper, titanium, or other reflective metals and their alloys. ARCs improve photoresist patterning control by reducing standing wave effects or diffuse scattering caused by reflection of radiation offreflective surfaces. These problems are magnified when monochromatic illumination sources are used. Furthermore, as microcircuit density increases, scattering, diffraction, and interference effects become less and less tolerable. As circuit density increases and feature size and line widths decrease below the 0.18-$\mu$m level, such effects become increasingly critical. As line widths approach the 0.20-$\mu$m level, deep ultraviolet (DUV) exposure sources are commonly used to expose photoresists and provide the necessary definition in mask patterns. DUV radiation can be loosely defined as radiation between the wavelengths of 4–400 nanometers (nm). Typical sources of such radiation are, for example, cadmium, xenon, or mercury lamps, and certain types of excimer lasers. DUV sources are used because it is critically important to produce sharply defined mask patterns. To this end, reflected light must be reduced in order to maximize photoresist pattern definition.

Prior to the use of DUV exposure sources and DUV photoresists, a metallization layer (typically formed of aluminum) was coated with an antireflective layer of titanium nitride (TiN) followed by a spin coating of photoresist. This photoresist was then patterned and subsequently etched, then the photoresist was removed. The TiN layer remained in place to help prevent electromigration and serve as a shunt layer permitting continuous current flow, in the event of void formation in the metallization layer. However, due to the increased resolution possible with DUV exposure sources and the need for smaller and smaller feature sizes, the art has moved towards DUV exposure sources and photoresists optimized to take advantage of DUV sources. Unfortunately, TiN ARCs undergo chemical reactions with DUV photoresists and, therefore, are not compatible with the new photoresists. There is a need for new solutions to the old problem of metallization reflectance.

The well understood and commonly used process procedures previously used are not compatible with the use of DUV exposure sources. New photoresists which are sensitive to DUV light have come into use. However, these DUV photoresists present new problems. The new photoresists are chemically-amplified resists, which means that through chemical treatment, a chemically-amplified resist is more sensitive to light than its non-amplified predecessors. Chemically-amplified resists require less exposure time. For example, standard I-line (365 nm) lithographic exposure requires 200 milliJoules (mJ) of activation energy to develop a standard photoresist. In comparison, a typical chemically-amplified resist may only require 10 mJ (at 248 nm). Such typical chemically-amplified resists are manufactured under the trade names of Apex or UV05, both made by Shipley Company of Marlborough, Mass. However, these new photoresists react to nitrogen containing compounds. Consequently, these photoresists react with the previously used TiN or silicon nitride antireflective layers as well as ambient nitrogen in typical reaction chambers.

Figure 1A:
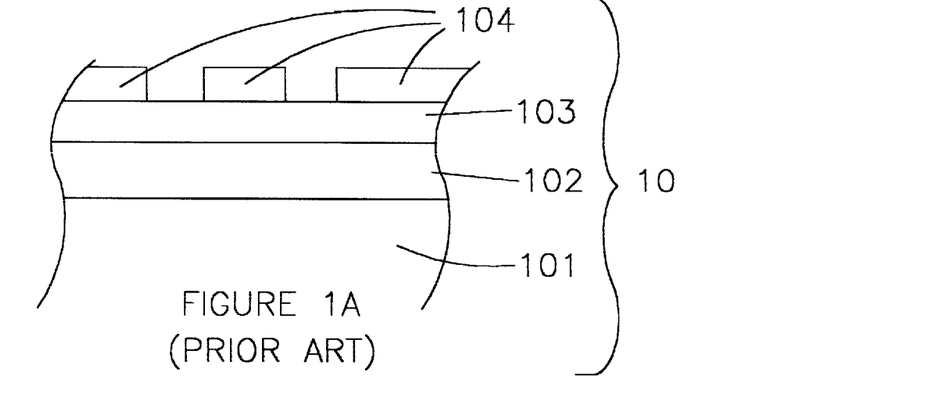
FIGS. 1A–1C are cross-section views of a semiconductor substrate showing the deleterious effects of present art processes which place a deep ultraviolet photoresist on a nitrogen-containing ARC in a nitrogen-containing ambient atmosphere.
Figure 1B:
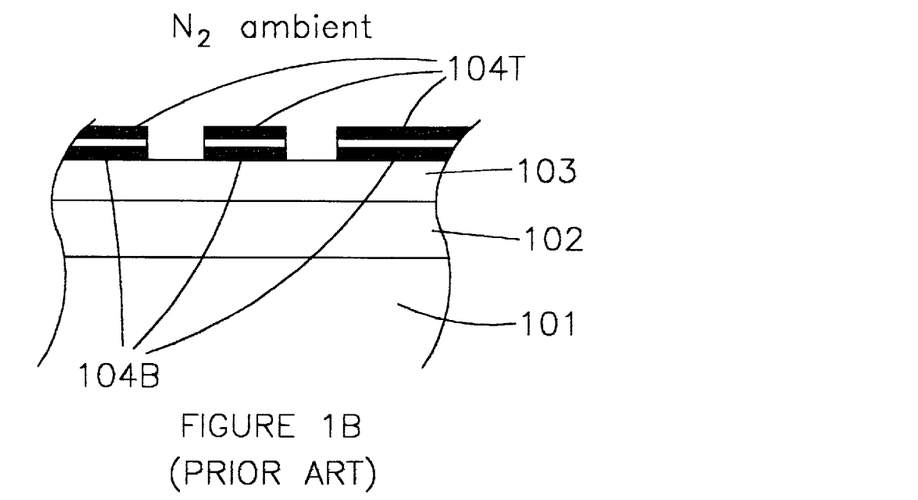
Figure 1C:
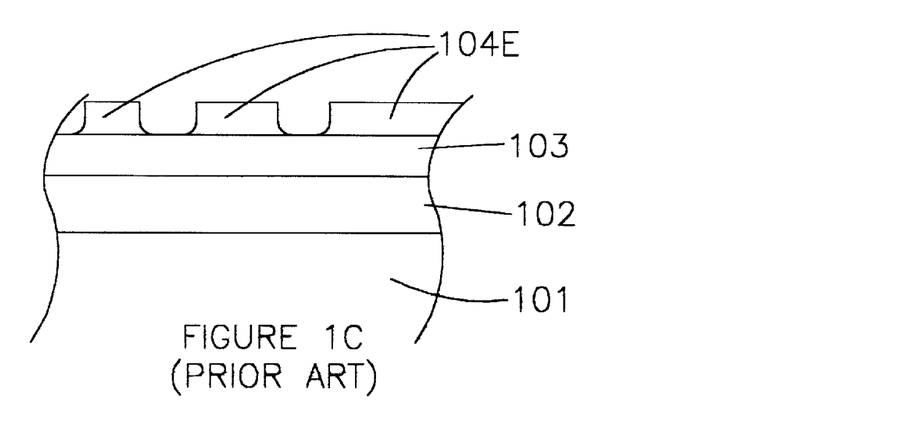

FIGS. 1A–1C show the unhappy effect of using DUV photoresists in conjunction with a TiN ARC. FIG. 1A is a cross-section view of a portion of an integrated circuit structure identified generally as 10, having a semiconductor substrate 101, with a reflective metallization layer 102, and a TiN ARC 103, and a DUV photoresist mask pattern 104. As shown in FIG. 1B, the exposed portions of the DUV photoresist 104T react with the nitrogen containing ambient and also with the nitrogen containing TiN ARC layer 103 in region 104B. The effects of this exposure to nitrogen degrade the photoresist as shown in FIG. 1C, creating the irregularly shaped and undesirable photoresist profiles 104E.

Figure 1D:
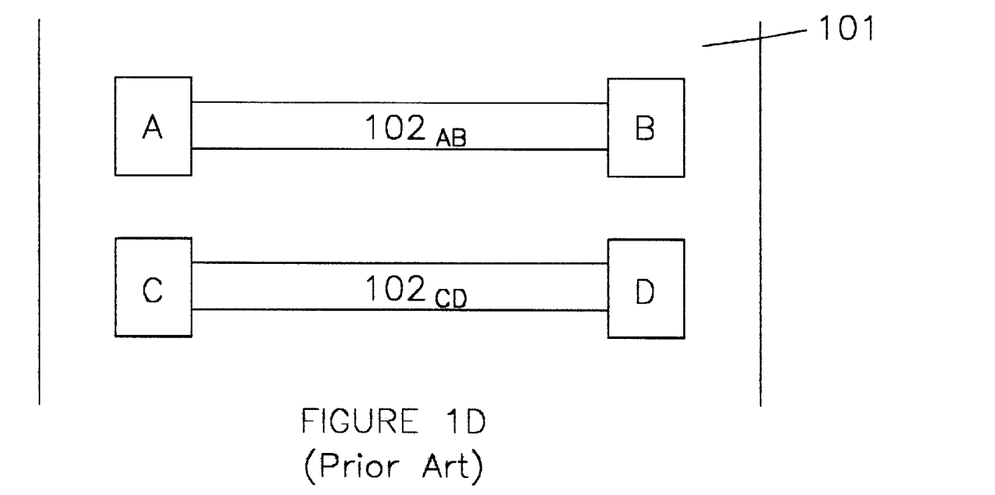
FIGS. 1D–1E are plan views of a semiconductor substrate showing the deleterious effects of placing a deep ultraviolet photoresist on a nitrogen-containing ARC in a nitrogen-containing ambient atmosphere.
Figure 1E:
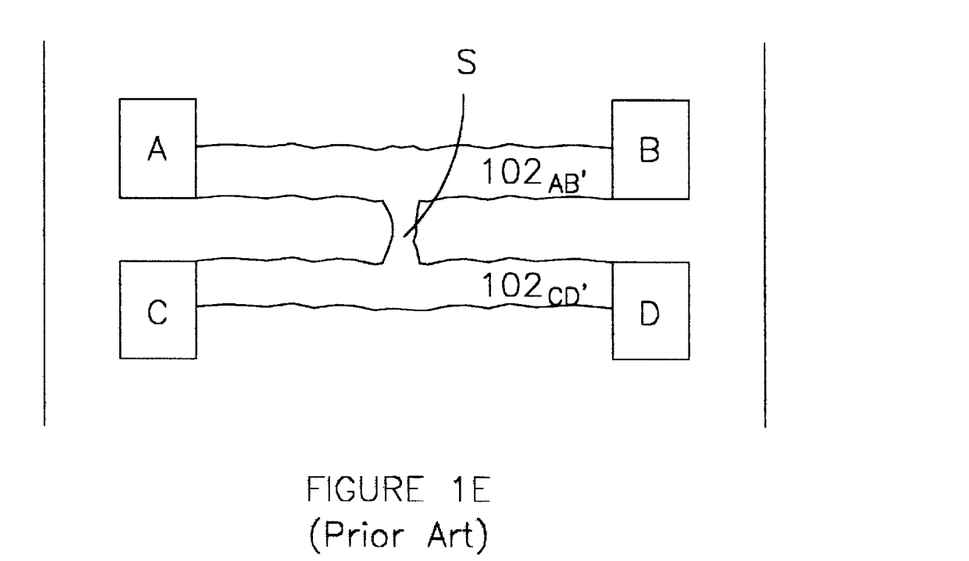

FIGS. 1D–1E are plan views of a semiconductor surface which further illustrate some of the problems associated with DUV photoresists and nitrogen-containing ARCs. FIG. 1D shows an idealized structure on a semiconductor surface 101, having microcircuit components (A, B, C, & D) formed thereon. Elements A & B are electrically connected using an idealized metal interconnect $102_{AB}$. Elements C & D are also electrically connected using an idealized metal interconnect $102_{CD}$. The sharply defined features of the metal interconnects $102_{AB}$ & $102_{CD}$ are desired. Unfortunately, due to the photoresist degradation disclosed above, interconnect problems arise. For example, as in FIG. 1E, the microcircuit components (A, B, C, & D) are electrically connected by the less than ideal interconnects $102_{AB}'$ & $102_{CD}'$. A common effect is interconnect shorting, as shown by S, where separate metallization layers contact each other.

Despite this drawback, DUV photolithography has come in to ever more frequent use due to the increased definition possible with DUV lithography. A great need has arisen for ARC materials that are compatible with the newer photoresists.

One solution is to provide a sacrificial layer of oxide (e.g., silicon dioxide ($SiO_2$)) over the TiN ARC layer, followed by the application of a DUV photoresist. The sacrificial layer provides a barrier between the TiN ARC and the DUV photoresist. The photoresist is then patterned and fabrication continues as is needed to create the necessary circuit structures. The problem with the oxide sacrificial layer is that it adds an additional process step to each metallization layer. It also requires a separate machine for creating such layers. This drives up cost and increases manufacturing time, in addition to increasing the complexity of the process. Further, by forming an oxide sacrificial layer this process increases the possibility of harmful particle formation during fabrication.

Others have postulated the use of a TiN/Ti ARC bi-layer. The TiN layer is fabricated over the metallization layer, followed by a layer of metallic titanium (Ti) formed over the TiN layer. The top Ti layer prevents a subsequently formed DUV photoresist layer from contacting the TiN layer, thereby preventing the DUV photoresist from reacting with the nitrogen in the TiN layer. Unfortunately, this ARC has the same drawbacks as the sacrificial oxide layer process, namely it is a two step, two chamber process. Furthermore, in a conventional process, the TiN deposition chamber requires Ti pasting to prevent TiN from flaking off the interior surfaces of the chamber, which decreases throughput.

Unfortunately, it has also been observed that with aluminum (Al) metallization layers, a highly resistive Al—N layer may be formed at the interface between the Al metallization layer and a TiN ARC. A solution to this problem is set forth in U.S. Pat. No. 5,582,881 by Besser et al. which uses a Ti layer to form a barrier between the Al metallization layer and a TiN ARC layer. Again, this does not solve the problem of DUV photoresist reactivity with the TiN top layer.

In U.S. Pat. No. 5,231,053 by Bost et al., a TiN/Ti/TiN tri-layer is used as a coating to prevent a reaction of underlying aluminum with ambient oxygen and fluorine containing etchants. Unfortunately, the upper TiN layer negatively reacts with a subsequently applied DUV photoresist layer. The invention of Bost et al. also has a TiN top layer which contacts the overlying DUV photoresist and therefore does not solve the problem of nitrogen reacting with DUV photoresist. Further, unlike the present invention, the process of Bost et al. disadvantageously requires an additional process step to return a Ti target to an un-nitrided state.

In U.S. Pat. No. 5,738,917 ('917), Besser et al. used a Ti/TiN/Ti layer as an underlayer for a subsequently fabricated Al metallization layer. This structure is used to reduce electromigration of Al into underlying substrates, particularly silicon. Furthermore, the Ti/TiN/Ti layer of '917 is covered with metal rather than photoresist, as in the present invention. Thus, the Ti/TiN/Ti stack of '917 does not protect an overlying DUV photoresist layer from the harmful effects of TiN nor does it serve as an ARC to enhance metallization etching. In fact, '917 uses a TiN ARC which causes exactly the type of problem the present invention seeks to remedy (i.e., preventing DUV photoresist reaction with the TiN ARC). Furthermore, the Ti/TiN/Ti stack structure of '917 may be easily incorporated as a supplementary underlayer in conjunction with the ARC of the present invention.

In U.S. Pat. No. 5,317,187 ('187), Hindman et al. used a Ti/TiN/Ti underlayer beneath a subsequently fabricated Al metallization layer. This structure is formed above an underlying silicon or passivation layer. The Al metallization layer is then overlaid with a single layer TiN ARC, unlike the three layer ARC stack of the present invention. The purpose of the Ti/TiN/Ti layer of '187 is to react the bottommost Ti layer with the underlying silicon to form a $TiSi_2$ contact metallization layer. Thus, the Ti/TiN/Ti stack of '187 is not formed over a metallization layer, but rather under it. In fact, the Ti/TiN/Ti stack of '187 must be formed on top of a silicon layer. The absence of a silicon layer prevents the formation of a silicide layer, which defeats the purpose of '187. In being underneath the metallization layer, the Ti/TiN/Ti stack of '187 cannot protect an overlying DUV photoresist layer from the harmful effects of TiN nor can it serve as an ARC to enhance metallization etching. In fact, by placing the aluminum metallization layer on top of the Ti/TiN/Ti stack, the structure of '187 exacerbates the metallization reflectivity problem the present invention seeks to resolve. Finally, the TiN ARC structure of the '187 patent is incompatible with DUV photoresists.

In view of the above, there is a need for overcoming the difficulties and drawbacks of presently used ARC's in conjunction with DUV photoresists. In particular, there is a need for an effective and easily manufacturable ARC which does not chemically react with DUV photoresists or metallization layers, for minimizing light reflection in a photoresist from underlying reflective surfaces during photolithographic exposure of the photoresist, for providing an effective ARC layer which does not chemically react with either the underlying metallization layer or undergo chemical reaction with DUV photoresists, providing an effective ARC which may be formed using only one chamber of a multichamber physical vapor deposition (PVD) system, and providing an improved process for producing integrated circuit structures.

SUMMARY OF THE INVENTION

The present invention addresses the foregoing needs by providing a three-(3) layered ARC. Briefly, in accordance with the present invention, a highly reflective layer, such as a metallization layer (e.g., aluminum, aluminum alloy, copper, titanium, etc.) or a gate electrode layer (e.g., polysilicon), is formed on a semiconductor substrate then coated with a first layer of titanium metal. This titanium metal is formed to a thickness and chemical composition which will provide a barrier between said highly reflective layer and the subsequently fabricated layers and also make good contact with the underlying highly reflective layer. A next (second) layer comprising titanium nitride is formed over said first layer of titanium metal. The titanium nitride layer is formed to a thickness that provides strong absorptance of deep ultraviolet wavelengths used in photolithography. A third layer comprised of titanium is formed over the titanium nitride layer. This third titanium layer is formed to a thickness which will prevent the chemicals of a subsequently applied DUV photoresist from reacting with the underlying titanium nitride layer. After the three-layer ARC is formed, a DUV photoresist is applied and patterned. The underlying layers (including the highly reflective layer) are etched, forming current paths, device interconnects, gate structures, etc.. The Ti/TiN/Ti tri-layer remains in place.

In addition to advantageously preventing a reaction between the TiN layer and photoresist, the Ti/TiN/Ti layer may be advantageously formed in a single chamber of a multi-chamber physical vapor deposition machine, reserving other chambers for further processing.

Other features and advantages of the present invention will become presently apparent upon consideration of the following "Detailed Description of the Invention" and "Best Mode" together with the accompanying drawings.

BRIEF DESCRIPTION OF DRAWINGS

For a fuller understanding of the present invention, reference is made to the accompanying drawings in the following Detailed Description of the Invention and Best Mode sections. In the drawings.

Reference numbers refer to the same or equivalent parts of the invention throughout the several figures of the drawings.

DETAILED DESCRIPTION OF THE INVENTION

Figure 2:
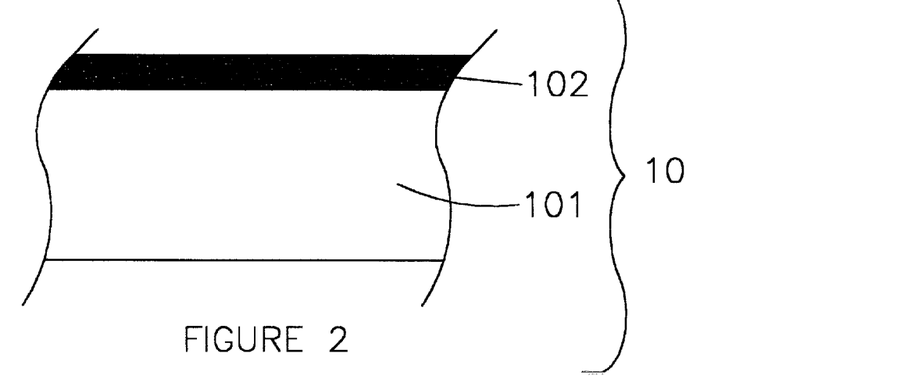
FIGS. 2–4 are cross-section views of a portion of a metallized semiconductor surface during the formation of the ARC layer of the present invention.

FIG. 2 shows a portion of a semiconductor wafer, identified generally as 10. The wafer 10 features a semiconductor substrate 101, having a metallization layer 102 formed thereon. Metallization layers 102 particularly benefitting from the present invention are those formed of highly reflective metals such as aluminum, copper, gold, silver, or titanium. The metallization layer 102 may be formed using typical methods known to practitioners having ordinary skill in the art.

Figure 3:
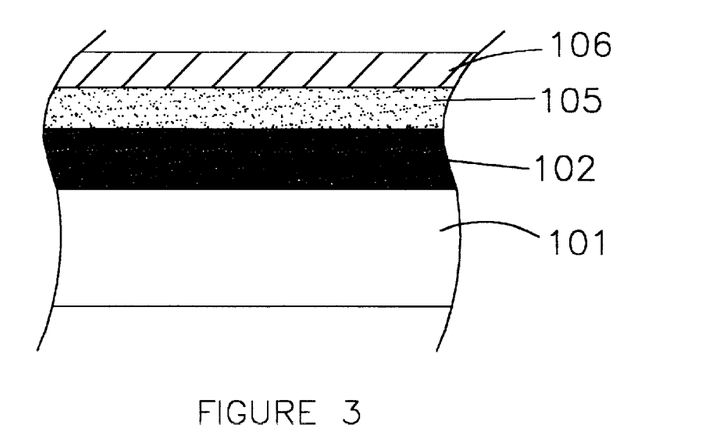

Referring to FIG. 3, a first layer of Ti metal 105 is formed on the metallization layer 102. The Ti layer 105 is formed to a thickness which will prevent contact between the metallization layer 102 and a subsequently formed TiN layer 106. Typical thicknesses for the first Ti layer 105 are between 50 Å–500 Å, preferably 150 Å. The TiN layer 106 is then formed to a thickness which allows for strong absorbance of the deep ultraviolet wavelength radiation used for deep submicron photolithography, thus forming an ARC. TiN ARC layers 106 having thicknesses between about 200 Å–2,000 Å and preferably about 1000 Å are satisfactory. The TiN layer 106 is typically formed by deposition techniques (e.g., evaporation, sputtering, or chemical vapor deposition). It may also be formed by thermal nitridation of a titanium layer at temperatures greater than 600° F. (i.e., approximately 315.56° C.) in $N_2$ or ammonia containing ambient atmospheres. However, the preferred process for deposition of TiN is physical vapor deposition from a suitable source.

Figure 4:
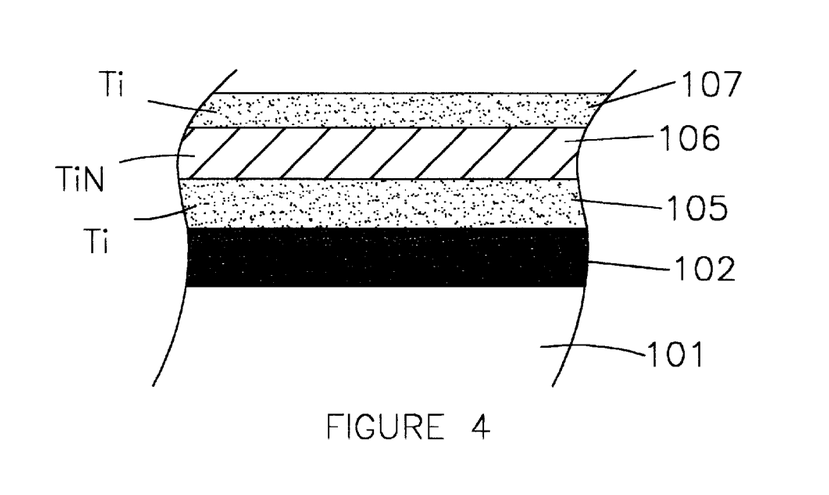

Referring to FIG. 4, a third layer 107 comprised of Ti is formed over the TiN ARC layer 106. The Ti layer 107 may be formed by any of the processes known to one with ordinary skill in the art, typically by sputtering. However, this layer 107 may also be formed advantageously as part of a single chamber deposition process. In accordance with the present invention, the Ti layer 107 is formed to a thickness which forms a barrier preventing chemical interaction between the TiN ARC layer 106 and a subsequently formed DUV photoresist layer 104, which will be patterned onto the Ti layer 106. Typically, the Ti layer 107 is between 50–500 Å thick, preferably 150 Å.

Figure 5:
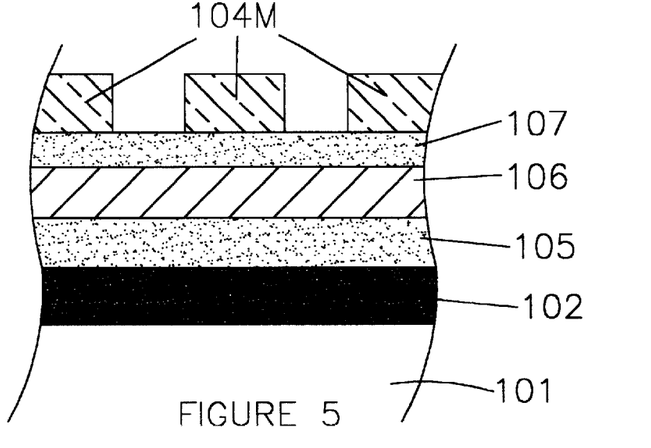
FIGS. 5–7 are cross-section views of a semiconductor substrate surface during the etching process of the present invention.

FIG. 5 shows a portion of a metallized semiconductor surface, as shown in FIG. 4, after the application of a DUV photoresist 104M, pattern masking, and development. The chemically-amplified resists used for DUV photolithography react with nitrogen containing molecules, in particular, TiN or free gaseous nitrogen contained in the ambient chamber atmosphere. By applying the DUV photoresist 104M over a Ti layer 107, contact is prevented between the photoresist pattern 104M and the TiN layer 106. Furthermore, by processing the photoresist in an environment that does not contain ambient nitrogen, the deleterious effects of nitrogen on the photoresist pattern 104M may be avoided.

Figure 6:
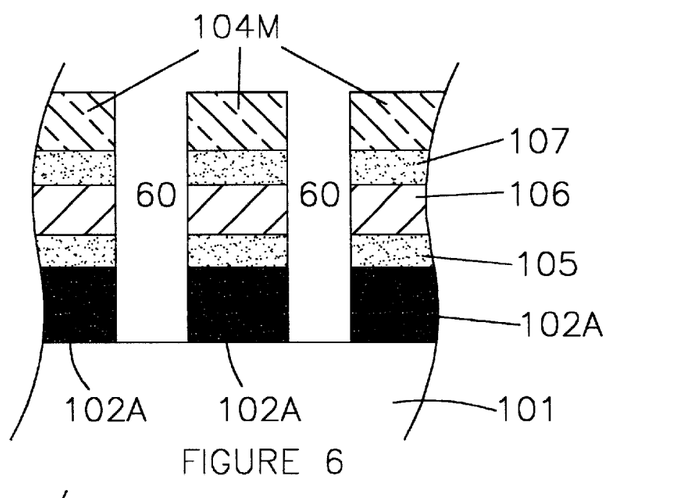
Figure 7:
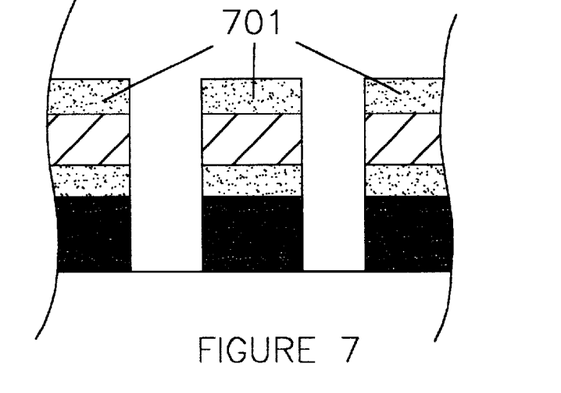

FIG. 6 depicts the etching away of the ARC layer (105, 106, & 107), and the metallization layer 102 in the region 60. This etching step is performed using ordinary etch techniques. Once etching is complete, the photoresist layer 104M is stripped (as in FIG. 7). This creates electrically separated conducting stacks 701.

BEST MODE

Figure 8:
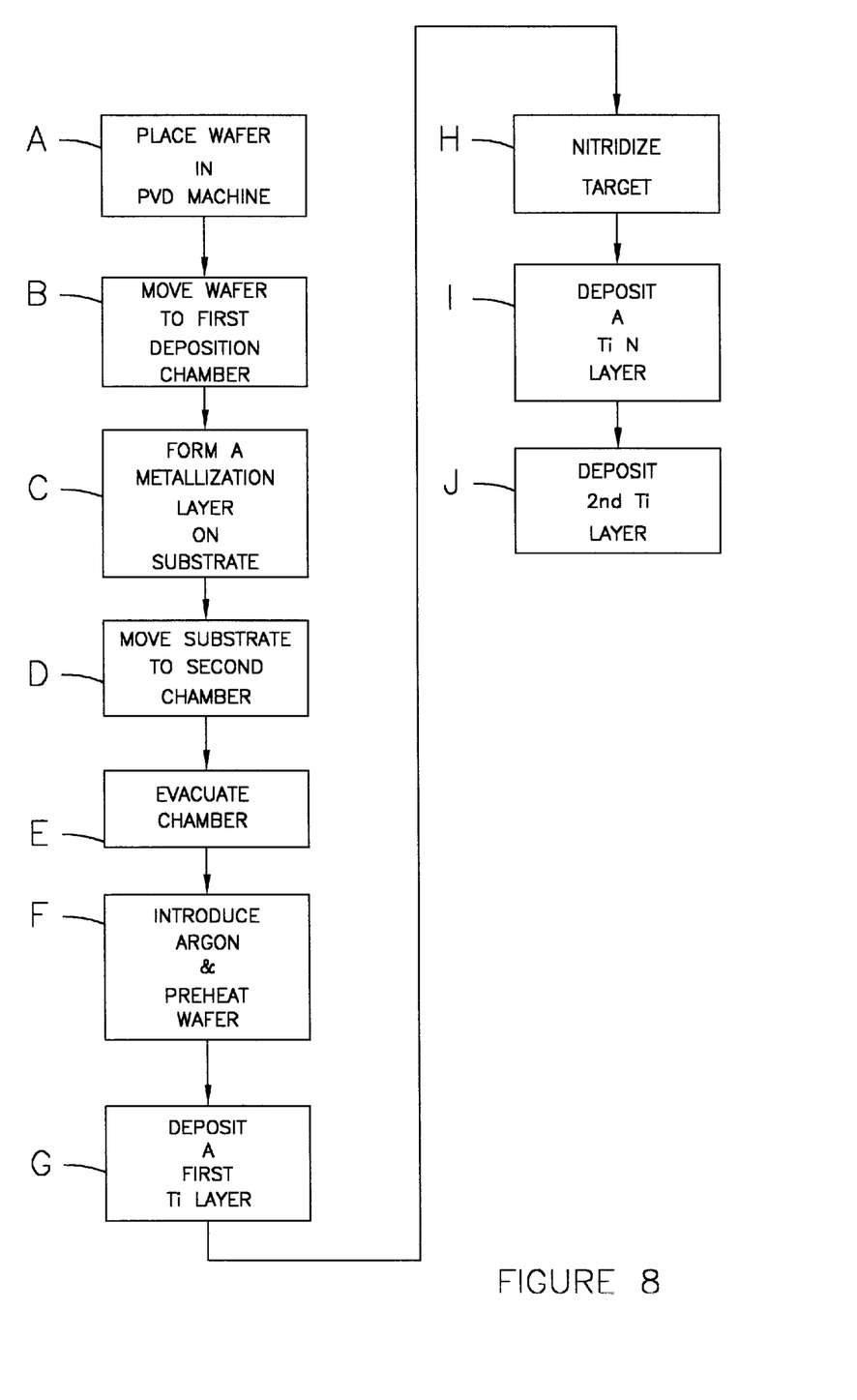
FIG. 8 is a flowchart detailing an ARC fabrication process using the present invention.

The flowchart shown in FIG. 8 outlines the process steps of the present invention used to prepare a semiconductor substrate for application of a DUV photoresist. The process begins with Step A by placing a substrate in a PVD machine. In Step B, the substrate is moved to a first deposition chamber. In Step C, a first metallization layer is formed on said substrate. The substrate is then moved to a second deposition chamber in Step D. The second chamber is evacuated in Step E. In Step F, the wafer is preheated and Argon gas is introduced into the second chamber. In Step G, the Argon is ignited into a plasma and a first Ti layer is deposited on the wafer. If a single-chamber ARC deposition process is used, the substrate remains in the second chamber for Step H where the Ti target is nitrided. In Step I, Argon plasma is again ignited and TiN is deposited on the wafer. In keeping with a single chamber process, in Step J a second Ti layer is deposited in said second chamber. The wafer is now prepared for the application of photoresist or other processing.

Figure 9:
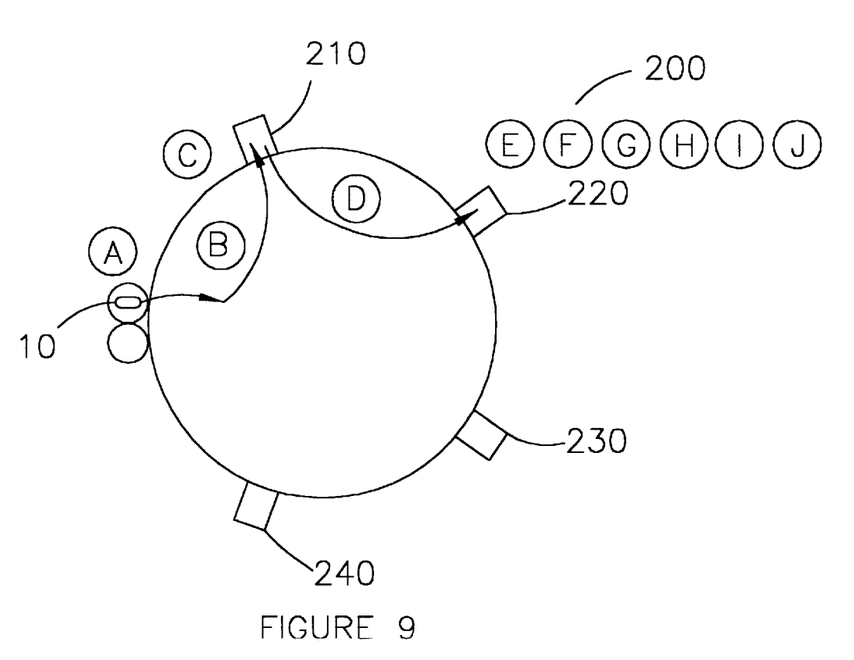
FIG. 9 is a plan view of a multi-chamber PVD tool used in accordance with the principles of the present invention.
Figure 10:
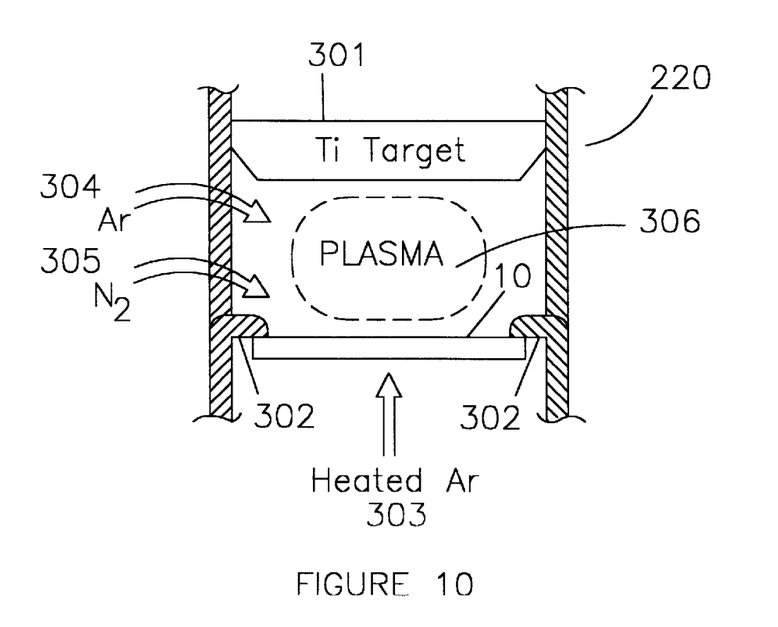
FIG. 10 is a cross-section view of a single deposition chamber used to apply the ARC layer of the present invention.

Referring to FIGS. 8, 9, & 10, a "single-chamber" process flow used for the formation of the Ti/TiN/Ti ARC layer of the present invention is shown. The preferred embodiment uses a deposition system 200, having four physical vapor deposition (PVD) chambers (210, 220, 230, & 240). An example of such a system is an Endura 5500 made by Applied Materials, Inc. of Santa Clara, Calif. Of course, PVD deposition chambers or systems available from other manufacturers may be used instead. In Step A, wafer 10 is placed inside a PVD machine 200. In Step B, the wafer 10 is moved into a first chamber 210 of the device 200 for metallization deposition. Chamber 210 is typically used for substrate metallization (as in Step C of FIG. 8) which deposits, for example, polysilicon, aluminum, copper, silver, gold, nickel or metallic alloys onto the substrate 10. A robot arm (not shown) is used to move the wafer 10 in and out of the chambers (210, 220, 230, & 240).

Still referring to FIGS. 4, 8, 9, & 10, in Step D, the wafer 10 is moved into chamber 220 for further deposition. In this application, a single chamber 220 is used for forming the three layer ARC. Chamber 220 is advantageously used for deposition of the initial Ti layer 105 over the metallization layer 102, TiN deposition 106, as well as a final Ti deposition 107 (i.e., Steps E–J). Throughput is increased in the single chamber ARC deposition process of the present invention as compared to a multichamber deposition process using as many as three separate chambers to form the Ti/TiN/Ti layer of the present invention. Thus, the present method leaves the third and fourth chambers (230 & 240) available for other concurrent processes. As indicated in FIG. 10, in a deposition chamber 220 of a PVD system 200, a wafer 10 is held approximately 45 to 54 mm from a Ti target 301 by heater clamp 302. The chamber 220 generally features at least three gas lines, an $N_2$ gas line 305, a lower heated argon (Ar) gas line 303, and a top unheated Ar gas line 304. Once the wafer 10 is in place, the gas lines for providing various gases to the chamber are closed and the chamber 220 is evacuated to a pressure of approximately $10^{-6}$–$10^{-9}$ Torr. As a result, in Step E, the chamber 220 is evacuated to a base pressure of approximately $10^{-6}$–$10^{-9}$ Torr. This step takes approximately five seconds to complete.

Referring again to FIGS. 8, 9, & 10, in a preheat Step F, the wafer 10 is placed against the heater clamp 302, and 10–20 standard cubic centimeters per minute (SCCM) of heated Ar gas is supplied into the chamber 220 from below the sample 10, with a preferred flow rate of 15 SCCM. This effectively preheats the wafer 10. The wafer 10 is then heated to a temperature ranging between about 250–450° C, preferably 250° C. However, any temperature may be used depending on the film quality desired. A Ti target 301 is spaced approximately 45–54 mm from the wafer 10. However, a spacing of about 52 mm is optimal for Ti deposition in an Endura 5500 machine. Different spacings may be preferred for other manufacturers' machines.

Referring again to FIGS. 3, 8, 9, & 10, in Step F, unheated Ar gas 304 is then introduced into the chamber 220 from above the wafer 10 for generating a plasma. Any flow rate of Ar gas may be used so long as enough Ar is provided to create a suitable plasma. However, typical Ar gas flows range between 20–100 SCCM, with a preferred rate of 40 SCCM of Ar gas. This step takes approximately 15 seconds. At this point, the wafer 10 is prepared for the first Ti deposition step. In Step G, plasma 306 is created in the chamber 220 by applying a voltage across a Ti target 301 and the wafer 10. In this embodiment, a 3000-W plasma is used, although any power level can be used depending on the sputtering rate and coverage desired. Typically, power levels greater than 1000 W are needed. The plasma pressure can range anywhere from a few to several hundred mTorr. A collimator is not necessary, and would, if used, slow down the deposition process reducing throughput. Typically, the process is continued until a first layer of Ti 105 approximately 150 Å is deposited on the wafer 10 (approximately 5–7 seconds). Actual Ti layer 105 thicknesses are constrained by the manufacturability of thin Ti layers and by metal resistance for thick Ti layers, since Ti and aluminum react to form $TiAl_3$ (which consumes the Al alloy).

As shown in FIGS. 3, 8, 9, & 10, to form the TiN layer 106, a nitriding Step H is required. The plasma 306 is terminated by terminating the power, and introducing $N_2$ gas 305 into the chamber 220. The introduction of $N_2$ gas into the chamber places the Ti target 301 in a nitrided mode for TiN deposition. Typically, a $N_2$ gas flow of between 40–200 SCCM is used. However, any gas flow can be used that provides sufficient nitrogen under the existing conditions to place the Ti target 301 into a nitrided mode; a preferred flow rate is 90 SCCM of $N_2$. During nitriding, the Ar flow is reduced to a lower value, typically about 34 SCCM.

As depicted in FIGS. 3, 8, 9, & 10, once the target 301 has been properly nitrided (Step H), TiN is deposited on the Ti layer 105 of the wafer 10 in Step I. Plasma is again created by applying a voltage across the nitrided Ti target 301 and sample 10. Any power level can be used depending on the sputtering rate and coverage desired. Typically, power levels greater than 5000 W are used to achieve a satisfactory sputtering rate. However, a 6500-W plasma is preferred because of the lower sputtering rate of TiN (as compared to Ti). The $N_2$ gas, Ar gas, and heated Ar gas flows are maintained and after approximately 42 seconds, 1000 Å of TiN is deposited on the first Ti layer 105 of the wafer 10. Although 1000 Å is the preferred thickness for the TiN ARC layer 106, any thickness that provides strong DUV radiation absorbance is suitable and the actual thickness depends on process integration. Typically, actual thicknesses vary from approximately 200 Å to 2000 Å.

As depicted in FIGS. 4, 8, 9, & 10, the final Ti deposition Step J begins by terminating the plasma and closing the gas lines. $N_2$ gas is then evacuated from the chamber. This step takes approximately four seconds to complete. It can be appreciated that the Ti target 301 remains in a semi-nitrided mode. As in the first Ti deposition step, the chamber 220 is supplied with Ar gas in an appropriate concentration and temperature. For example, heated Ar gas is supplied below the wafer 10 at approximately 15 SCCM while unheated Ar is supplied above the wafer 10 at about 40 SCCM. Again, plasma is ignited in the chamber 220 by applying a voltage across the semi-nitrided Ti target 301 and the wafer 10. Normally, about 3000 W is required. These conditions allow a Ti layer 107 approximately 250 Å thick to be deposited on the TiN layer 106 in approximately ten seconds. It can be appreciated that despite the discrete delineation between the TiN layer 106 and the second Ti layer 107 indicated in FIG. 4, the change from TiN to Ti is somewhat more gradual as the nitrided Ti must be first removed from the target 301 before the underlying pure Ti may be deposited on the wafer 10. Advantageously, this second Ti deposition step serves to paste the interior of the chamber 220, eliminating the need for periodic, separate Ti pasting steps. The thickness of the final Ti layer 107 must be such that it prevents interaction between the underlying TiN layer 106 and the subsequently formed photoresist layer 104. Typical second Ti layers 107 are between 50 and 500 Å thick. Also advantageously, the final Ti deposition step completely returns the Ti target 301 to an un-nitrided state in readiness for further Ti deposition without further process steps.

Once the Ti/TiN/Ti tri-layer ARC is applied, the substrate stands ready for the application of the DUV photoresists. Typically, such photoresists are spun on and patterned by methods known to those with ordinary skill in the art.

It should be noted that the process of forming a Ti/TiN/Ti ARC can use as many as three chambers of the PVD tool 200. For example, metallization 102 is conducted in a first chamber 210, the wafer 10 is moved to a second chamber 220, where a first Ti layer 105 is deposited. The wafer is then moved to a third chamber 230, where a TiN layer 106 is deposited. This has the advantage of creating an abrupt transition between the first Ti layer 105 and the TiN layer 106. The wafer 10 may then be moved to a fourth chamber 240 for deposition of a second Ti layer 107. By moving the sample 10 to the fourth chamber 240, an abrupt transition between the TiN layer 106 and the second Ti layer 107 may be created.

Figure 11:
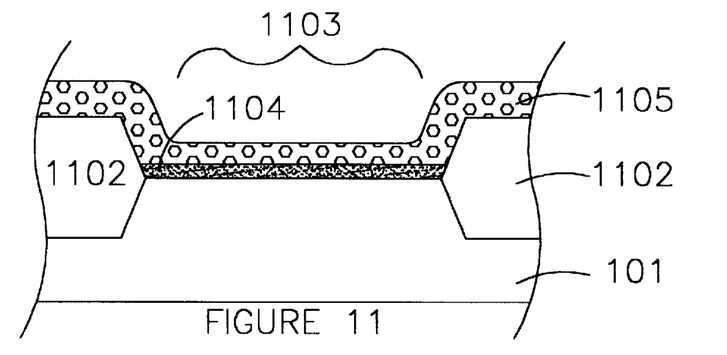
FIGS. 11–14 are cross-section views of a semiconductor substrate used in the formation of transistor gate structures in accordance with the principles of the present invention.
Figure 12:
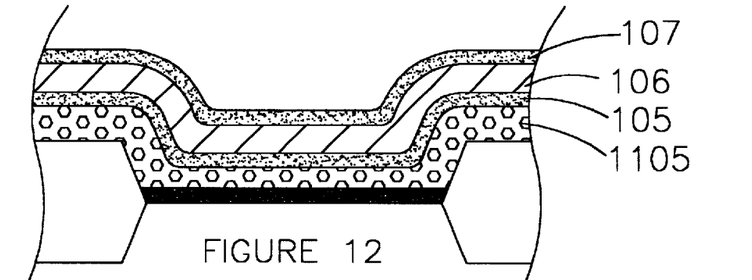
Figure 13:
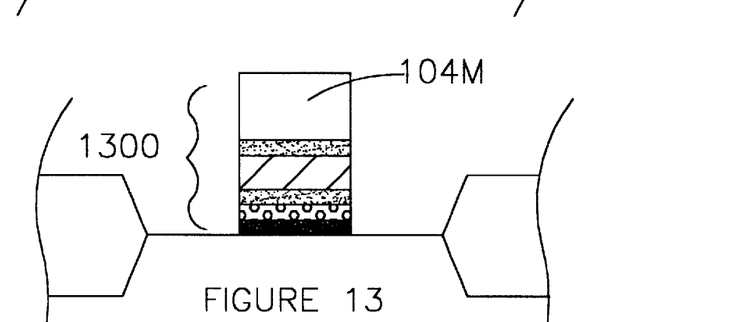
Figure 14:
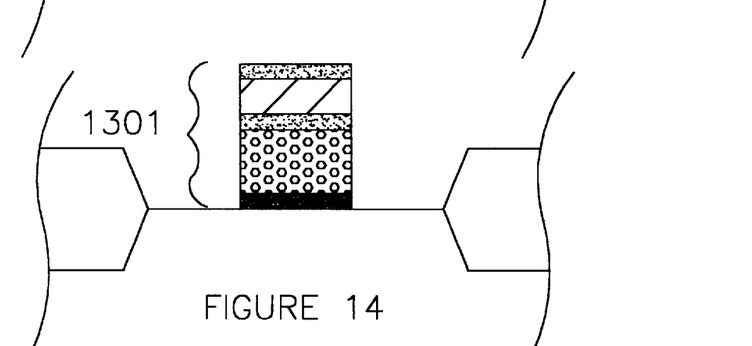

Alternatively, the principles of the present invention may be used to construct gate type structures, as shown in FIGS. 11–14. For example, a semiconductor substrate 101 having isolation structures 1102 (shown here as field oxide regions) defining an active region 1103 is provided. As shown in FIG. 11, the active region 1103 typically has a gate oxide layer 1104 and a gate electrode material layer 1105 (formed using, for example, polysilicon). In accordance with the principles disclosed hereinabove, a Ti/TiN/Ti ARC (105, 106, 107) is formed atop the gate electrode layer 1105, as shown in FIG. 12. This structure is pattern masked with DUV photoresist 104M, and etched to form a structure 1300, as in FIG. 13. The DUV photoresist is stripped leaving a gate structure 1301, as shown in FIG. 14, for further processing. The processes are essentially the same as those used to fabricate the metallization structures disclosed herein.

The present invention avoids the extra step of inserting a sacrificial layer on top of an ARC layer avoiding the additional monetary cost and avoiding the potential for particle creation and decreasing process complexity. The present invention also has the advantage of being applicable to a single deposition chamber on a multi-chamber PVD tool thereby reducing costs and reducing particle creation. The Ti self-pasting aspect of the single chamber process also reduces particles in the PVD chamber. Furthermore, the application of a final Ti layer returns the Ti target into a non-nitrided state in preparation for the next wafer without further preparation thereby increasing process efficiency (in comparison to current ARC processing (Ti/TiN) which leaves the target in a nitrided mode).

The foregoing description of the present invention has been presented for purposes of illustration and description. The foregoing is not intended to be an exhaustive description nor is it intended to limit the invention to the precise form disclosed. Many modifications and variations of the present invention will be apparent to practitioners skilled in the art. In particular the invention envisions use with alternative metallization layers and gate materials. The invention may be practiced using other fabrication techniques and with other fabrication technologies in MOS or bipolar processes. Similarly, the process steps described may be interchangeable with other steps in order to achieve the same result. The embodiment was chosen and described to best explain the principles of the invention and its practical application.

What is claimed is:

1. A method for fabricating microcircuit structures using a tri-layer antireflective coating, deep ultraviolet exposure source, and deep ultraviolet photoresists, comprising the steps of:
   providing a semiconductor substrate having formed thereon at least one gate electrode;
   forming a tri-layer anti-reflective coating disposed on said at least one gate electrode, said anti-reflective coating being formed by:
   a) forming a first layer over said at least one gate electrode, said first layer comprising titanium (Ti);
   b) forming a second layer over said first layer, said second layer comprising titanium nitride (TiN);
   c) forming a third layer over said second layer, said third layer comprising titanium (Ti);
   forming a patterned layer of deep ultraviolet photoresist over said third layer, said photoresist layer having openings defining a mask pattern;
   etching said through openings in said photoresist mask pattern to remove some of said anti-reflective coating and some of said substrate to form microcircuit structures; and
   stripping off said deep ultraviolet photoresist,
   whereby said antireflective coating facilitates absorption of deep ultraviolet light emitted from said deep ultraviolet exposure source during said forming of said patterned deep ultraviolet photoresist layer, and
   whereby said antireflective coating prevents said titanium nitride layer member from releasing nitrogen into said patterned deep ultraviolet photoresist layer.

2. A method, as recited in claim 1, wherein said steps a), b), and c) of forming said first, second, and third layers comprise forming said layers via a physical vapor deposition process.

3. A method, as recited in claim 2, wherein said steps of forming said first, second, and third layers require the deposition of each of said layers in a separate sputtering chamber of a physical vapor deposition tool.

4. A method, as recited in claim 2, wherein said steps of forming said first, second, and third layers comprise depositing said first, second, and third layers in the same sputtering chamber of a physical vapor deposition tool.

5. A method, as recited in claim 1, wherein the surface of said semiconductor substrate further comprises having a metallization layer.

6. A method, as recited in claim 5, wherein said metallization layer comprises at least one metal selected from a group consisting essentially of aluminum (Al), copper (Cu), gold (Au), silver (Ag), titanium (Ti), and their alloys.

7. A method, as recited in claim 5, wherein said first, second, and third layers are formed sequentially in the same deposition chamber of a physical vapor deposition system.

8. A method, as recited in claim 1, wherein said third layer comprised of titanium is formed to a thickness capable of preventing said deep ultraviolet photoresist layer from chemically reacting with said titanium nitride layer.

9. A method for fabricating microcircuit structures using an antireflective coating, deep ultraviolet exposure source, and deep ultraviolet photoresists, comprising the steps of:
   providing a semiconductor substrate;
   forming an anti-reflective coating on top of said semiconductor substrate, said anti-reflective coating being formed by:
   a) forming a first layer over said semiconductor substrate, said first layer comprising titanium material;
   b) forming a second layer, said second layer comprising titanium nitride material;
   c) forming a third layer over said second layer, said third layer comprising titanium material;
   forming a patterned layer of deep ultraviolet photoresist over said third layer, said photoresist layer having openings defining a mask pattern;
   etching said through openings in said photoresist mask pattern to remove some of said anti-reflective coating and some of said substrate to form microcircuit structures; and
   stripping off said deep ultraviolet photoresist,
   whereby said antireflective coating facilitates absorption of deep ultraviolet light emitted from said deep ultraviolet exposure source during said forming of said patterned deep ultraviolet photoresist layer, whereby said antireflective coating prevents said titanium nitride layer member from releasing nitrogen into said patterned deep ultraviolet photoresist layer, and wherein said titanium nitride layer is formed to a thickness capable of strongly absorbing deep ultraviolet radiation.

10. A method for fabricating microcircuit structures using an antireflective coating, deep ultraviolet exposure source, and deep ultraviolet photoresists, comprising the steps of:

providing a semiconductor substrate;

forming an anti-reflective coating on top of said semiconductor substrate, said anti-reflective coating being formed by:
  a) forming a first layer over said semiconductor substrate, said first layer comprising titanium material;
  b) forming a second layer, said second layer comprising titanium nitride material;
  c) forming a third layer over said second layer, said third layer comprising titanium material;

forming a patterned layer of deep ultraviolet photoresist over said third layer, said photoresist layer having openings defining a mask pattern;

etching said through openings in said photoresist mask pattern to remove some of said anti-reflective coating and some of said substrate to form microcircuit structures; and stripping off said deep ultraviolet photoresist, whereby said antireflective coating facilitates absorption of deep ultraviolet light emitted from said deep ultraviolet exposure source during said forming of said patterned deep ultraviolet photoresist layer, whereby said antireflective coating prevents said titanium nitride layer member from releasing nitrogen into said patterned deep ultraviolet photoresist layer, and wherein said first titanium layer has a thickness in the range of 50–500 Å and said titanium nitride layer has a thickness in the range of 200–2000 Å and said third layer comprising titanium material has a thickness in the range of 50–500 Å.

\* \* \* \* \*